US011380387B1

(12) United States Patent
He et al.

(10) Patent No.: US 11,380,387 B1
(45) Date of Patent: Jul. 5, 2022

(54) MULTIPLEXOR FOR A SEMICONDUCTOR DEVICE

(71) Applicant: Micron Technology, Inc., Boise, ID (US)

(72) Inventors: Yuan He, Boise, ID (US); Tae H. Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/209,650

(22) Filed: Mar. 23, 2021

(51) Int. Cl.
G11C 7/00 (2006.01)
G11C 11/4091 (2006.01)
G11C 7/10 (2006.01)
H01L 27/06 (2006.01)
H01L 27/108 (2006.01)

(52) U.S. Cl.
CPC ........ G11C 11/4091 (2013.01); G11C 7/1012 (2013.01); H01L 27/0688 (2013.01); H01L 27/10805 (2013.01)

(58) Field of Classification Search
CPC .............. G11C 11/4091; G11C 7/1012; H01L 27/0688; H01L 27/10805
USPC ......................................................... 365/149
See application file for complete search history.

(56) References Cited

U.S. PATENT DOCUMENTS

| | | | | |
|---|---|---|---|---|
| 6,480,424 B1 * | 11/2002 | Issa | ....................... | G11C 7/1006 365/189.02 |
| 7,009,880 B1 * | 3/2006 | Liu | ....................... | G11C 16/26 365/185.11 |
| 7,209,394 B1 * | 4/2007 | Dankert | .................... | G11C 7/02 365/189.02 |
| 10,607,995 B2 | 3/2020 | Roberts et al. | | |
| 2006/0083078 A1 * | 4/2006 | Sforzin | ..................... | G11C 7/12 365/189.06 |
| 2007/0047368 A1 * | 3/2007 | Imai | ......................... | G11C 7/18 365/230.03 |
| 2008/0278923 A1 * | 11/2008 | Losavio | ............. | H01L 25/0657 361/803 |

(Continued)

FOREIGN PATENT DOCUMENTS

KR  10-2016-0070245 A  6/2016

OTHER PUBLICATIONS

International Search Report and Written Opinion from related international application No. PCT/US2021/063209, dated Apr. 12, 2022, 9 pages.

*Primary Examiner* — Viet Q Nguyen
(74) *Attorney, Agent, or Firm* — Brooks, Cameron & Huebsch, PLLC

(57) ABSTRACT

A memory device can comprise an arrays of memory cells comprising a plurality of vertically stacked tiers of memory cells, a respective plurality of horizontal access lines coupled to each of the plurality of tiers of memory cells, and a plurality of vertical sense lines coupled to each of the plurality of tiers of memory cells. The array of memory cells can further comprise a plurality of multiplexors each coupled to a respective vertical sense line, wherein each of the plurality of multiplexors includes a first portion and a second portion, the first portion is coupled to the array of memory cells and the second portion is formed on a substrate material. The array of memory cells can further comprise a semiconductor under the array (SuA) circuitry comprising a plurality of sense amplifiers, each sense amplifier coupled to a respective subset of the plurality of multiplexors.

20 Claims, 10 Drawing Sheets

(56) References Cited

U.S. PATENT DOCUMENTS

| | | | |
|---|---|---|---|
| 2010/0165749 A1* | 7/2010 | Wu | G11C 7/1096 |
| | | | 365/189.02 |
| 2011/0194370 A1* | 8/2011 | Shiu | G11C 8/18 |
| | | | 365/230.03 |
| 2011/0310675 A1* | 12/2011 | Nobunaga | G11C 16/26 |
| | | | 365/185.25 |
| 2015/0162052 A1* | 6/2015 | Huang | G11C 11/417 |
| | | | 365/51 |
| 2016/0163730 A1 | 6/2016 | Lim et al. | |
| 2017/0206949 A1* | 7/2017 | Pickering | G11C 7/12 |
| 2017/0243659 A1* | 8/2017 | Heinrich-Barna | |
| | | | G11C 16/0433 |
| 2018/0323200 A1 | 11/2018 | Tang et al. | |
| 2019/0057734 A1* | 2/2019 | Onuki | H01L 27/1104 |
| 2019/0074277 A1 | 3/2019 | Ramaswamy | |
| 2019/0103406 A1 | 4/2019 | Tang et al. | |
| 2019/0164985 A1 | 5/2019 | Lee et al. | |
| 2020/0227418 A1 | 7/2020 | Kim et al. | |
| 2020/0357468 A1 | 11/2020 | Yip | |
| 2020/0411523 A1 | 12/2020 | Shin et al. | |
| 2021/0013226 A1 | 1/2021 | Tang et al. | |

\* cited by examiner

MULTIPLEXOR FOR A SEMICONDUCTOR DEVICE

TECHNICAL FIELD

The present disclosure relates generally to memory devices, and more particularly, to a multiplexor for a semiconductor device.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain region separated by a channel and body region. A gate may oppose the channel region and be separated therefrom by a gate dielectric. An access line, such as a word line, is electrically coupled to the gate of the DRAM cell. A DRAM cell can include a storage node, such as a capacitor cell, coupled by the access device to a sense line. The access device can be activated (e.g., to select the cell) by an access line coupled to the access transistor. The capacitor can store a charge corresponding to a data value of a respective cell (e.g., a logic "1" or "0").

DETAILED DESCRIPTION

Figure 1:
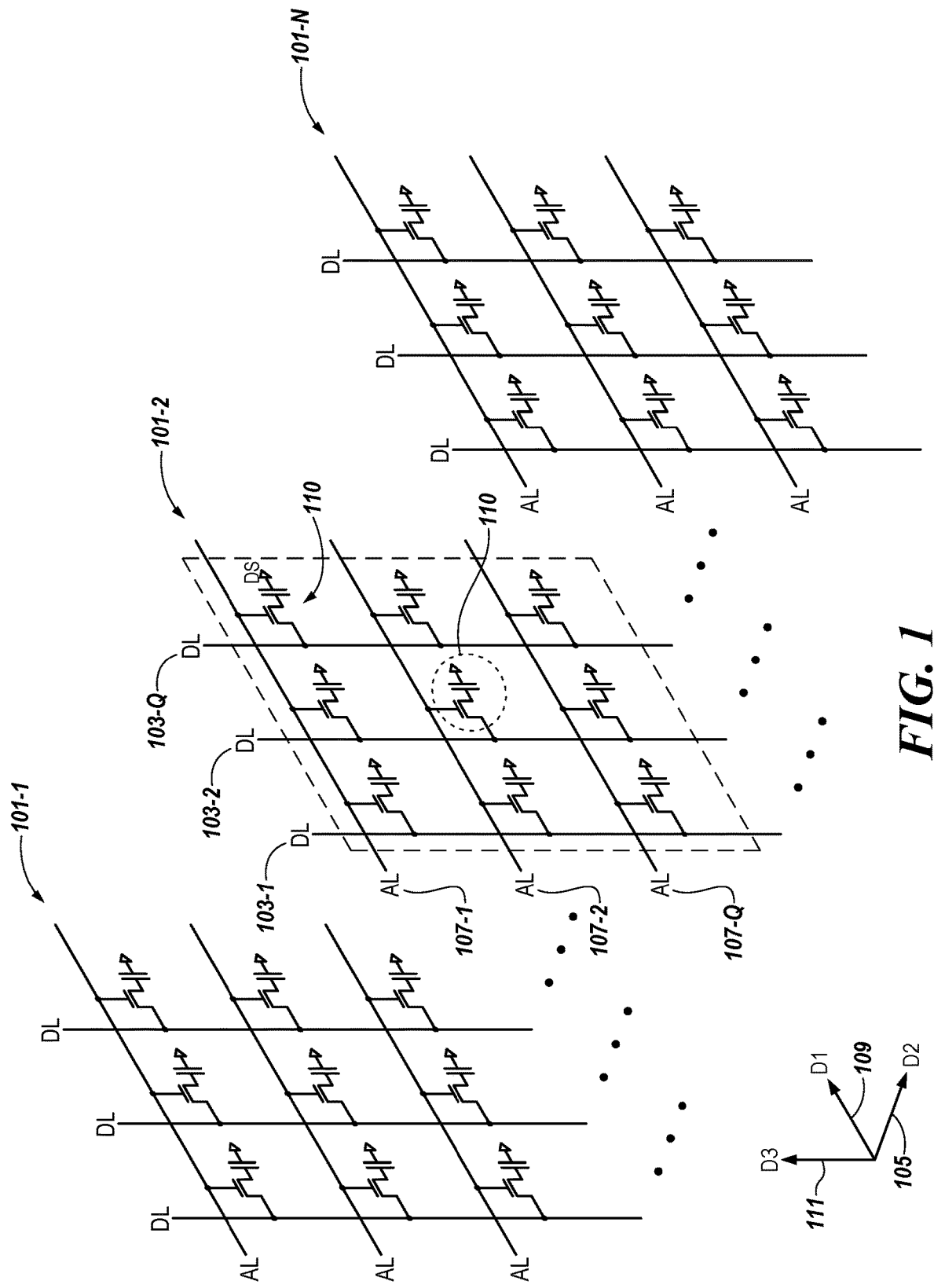
FIG. 1 is a schematic illustration of a vertical three-dimensional (3D) memory, in accordance a number of embodiments of the present disclosure.

Embodiments of the present disclosure describe a multiplexor for semiconductor devices. A first portion of the multiplexor is integrated into a bottom portion of an array of vertically stacked memory cells and a second portion of the multiplexor is built into a substrate below the array of vertically stacked memory cells. The array can include horizontal access devices, vertical sense lines, and horizontal access lines. Building a portion of the multiplexor into the vertical stack instead of building the entire multiplexor into a substrate material below the vertical stack increases the amount of available space under the bottom of the vertical stack and in the substrate material. The increased amount of available space may allow for additional circuitry, such as semiconductor under the array (SuA) circuitry to be formed under the vertical stack. Building a portion of the multiplexor into the vertical stack can also allow for the multiplexor to be built on a smaller die.

The figures herein follow a numbering convention in which the first digit or digits correspond to the figure number of the drawing and the remaining digits identify an element or component in the drawing. Similar elements or components between different figures may be identified by the use of similar digits. For example, reference numeral 230 may reference element "30" in FIG. 2, and a similar element may be referenced as 330 in FIG. 3A. Analogous elements within one figure may be referenced with a reference numeral followed by a hyphen and another numeral or a letter. For example, 203-1 may reference element 203-1 in FIGS. 2 and 203-2 may reference element 203-2, which may be analogous to element 203-1. Such analogous elements may be generally referenced without the hyphen and extra numeral or letter. For example, elements 203-1, 203-2, and 203-Q or other analogous elements may be generally referenced as 203.

FIG. 1 is a schematic illustration of a vertical three-dimensional (3D) memory in accordance a number of embodiments of the present disclosure. FIG. 1 illustrates a cell array that may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 107-1, 107-2, . . . , 107-Q (which also may be referred to a word lines). Also, each of the sub cell arrays, e.g., sub cell array 101-2, may include a plurality of sense lines 103-1, 103-2, . . . , 103-Q (which also may be referred to as bit lines, data lines, or digit lines). In FIG. 1, the access lines 107-1, 107-2, . . . , 107-Q are illustrated extending in a first direction (D1) 109 and the sense lines 103-1, 103-2, . . . , 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the sense lines 103-1, 103-2, ..., 103-Q are extending in a vertical direction, e.g., third direction (D3) 111.

A memory cell (e.g., 110) may include an access device (e.g., access transistor) and a storage node located at an intersection of each access line 107-1, 107-2, ..., 107-Q and each sense line 103-1, 103-2, ..., 103-Q. Memory cells may be written to, or read from, using the access lines 107-1, 107-2, ..., 107-Q and sense lines 103-1, 103-2, ..., 103-Q. The access lines 107-1, 107-2, ..., 107-Q may conductively interconnect memory cells along horizontal rows of each sub cell array 101-, 101-2, ..., 101-N, and the sense lines 103-1, 103-2, ..., 103-Q may conductively interconnect memory cells along vertical columns of each sub cell array 101-, 101-2, ..., 101-N. One memory cell (e.g., 110) may be located between one access line (e.g., 107-2) and one sense line (e.g., 103-2). Each memory cell may be uniquely addressed through a combination of an access line 107-1, 107-2, ..., , 107-Q and a sense line 103-1, 103-2, ..., 103-Q.

The access lines 107-1, 107-2, ..., 107-Q may be or include conducting patterns (e.g., metal lines) disposed on and spaced apart from a substrate. The access lines 107-1, 107-2, ..., 107-Q may extend in a first direction (D1) 109. The access lines 107-1, 107-2, ..., 107-Q in one sub cell array, e.g., 101-2, may be spaced apart from each other in a vertical direction, e.g., in a third direction (D3) 111.

The sense lines 103-1, 103-2, ..., 103-Q may be or include conductive patterns (e.g., metal lines) extending in a vertical direction with respect to the substrate (e.g., in a third direction (D3) 111). The sense lines in one sub cell array (e.g., 101-2) may be spaced apart from each other in the first direction (D1) 109.

A gate of a memory cell (e.g., memory cell 110) may be coupled to an access line (e.g., 107-2) and a first conductive node (e.g., first source/drain region) of an access device (e.g., transistor) of the memory cell 110 may be coupled to a sense line (e.g., 103-2). Each of the memory cells (e.g., memory cell 110) may be coupled to a storage node (e.g., capacitor). A second conductive node (e.g., second source/drain region), of the access device (e.g., transistor) of the memory cell 110 may be coupled to the storage node (e.g., capacitor). While first and second source/drain region reference are used herein to denote two separate and distinct source/drain regions, it is not intended that the source/drain region referred to as the "first" and/or "second" source/drain regions have some unique meaning. It is intended only that one of the source/drain regions is coupled to a sense line (e.g., 103-2), and the other may be coupled to a storage node.

Figure 2:
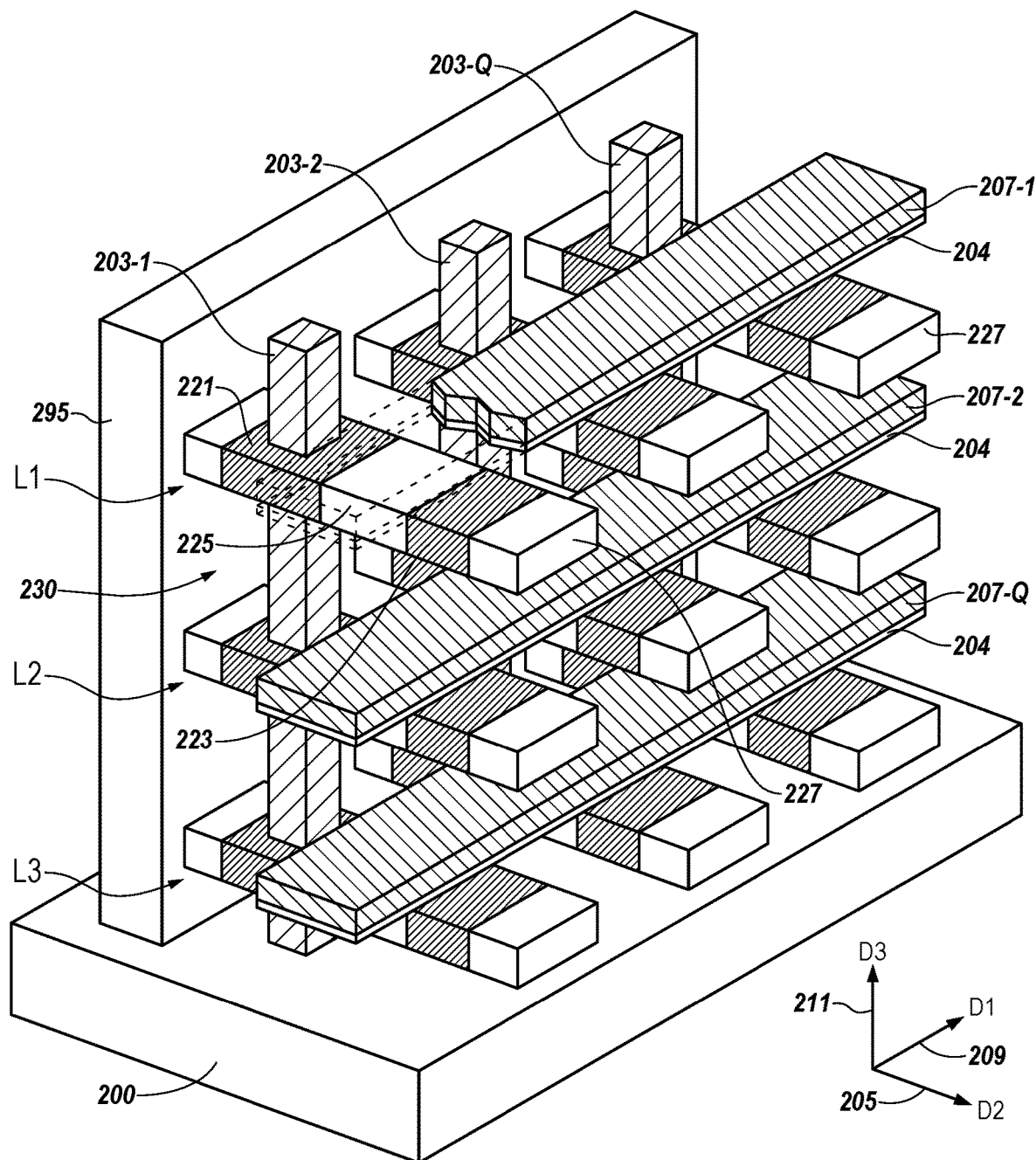
FIG. 2 is a perspective view showing a three-dimensional (3D) semiconductor memory device as a vertically oriented stack of memory cells in an array, in accordance with a number of embodiments of the present disclosure.

FIG. 2 illustrates a perspective view showing a three-dimensional (3D) semiconductor memory device (e.g., a portion of a sub cell array 101-2 shown in FIG. 1) as a vertically oriented stack of memory cells in an array, according to some embodiments of the present disclosure. As shown in FIG. 2, a substrate 200 may have formed thereon one of the plurality of sub cell arrays (e.g., sub cell array 101-2 described in connection with FIG. 1). For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertically oriented stack of memory cells (e.g., memory cell 110 in FIG. 1) extending in a vertical direction (e.g., third direction (D3) 211). According to some embodiments the vertically oriented stack of memory cells may be fabricated such that each memory cell (e.g., memory cell 110 in FIG. 1) is formed on plurality of vertical levels, e.g., a first level (L1), a second level (L2), and a third level (L3). The repeating, vertical levels, L1, L2, and L3, may be arranged, e.g., "stacked", a vertical direction, e.g., third direction (D3) 111 shown in FIG. 1. Each of the repeating, vertical levels, L1, L2, and L3 may include a plurality of discrete components, e.g., regions, to the horizontally oriented access devices 230, e.g., transistors, and storage nodes, e.g., capacitors, including access line 207-1, 207-2, ..., 207-Q connections and sense line 203-1, 203-2, ..., 203-Q connections. The plurality of discrete components to the horizontally oriented access devices 230, e.g., transistors, may be formed in a plurality of iterations of vertically, repeating layers within each level and may extend horizontally in the second direction (D2) 205, analogous to second direction (D2) 105 shown in FIG. 1.

The plurality of discrete components to the laterally oriented access devices 230, e.g., transistors, may include a first source/drain region 221 and a second source/drain region 223 separated by a channel region 225, extending laterally in the second direction (D2) 205, and formed in a body of the access devices. In some embodiments, the channel region 225 may include silicon, germanium, silicon-germanium, and/or indium gallium zinc oxide (IGZO). In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include Phosphorous (P) atoms and the p-type dopant may include atoms of Boron (B) formed in an oppositely doped body region of polysilicon semiconductor material. Embodiments, however, are not limited to these examples.

The storage node 227, e.g., capacitor, may be coupled to one respective end of the access device 230. As shown in FIG. 2, the storage node 227, e.g., capacitor may be coupled to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a memory cell may similarly extend in the second direction (D2) 205, analogous to second direction (D2) 105 shown in FIG. 1.

As shown in FIG. 2 a plurality of horizontal access lines 207-1, 207-2, ..., 207-Q extend in the first direction (D1) 209, analogous to the first direction (D1) 109 in FIG. 1. The plurality of horizontal access lines 207-1, 207-2, ..., 207-Q may be analogous to the access lines 107-1, 107-2, ..., 107-Q shown in FIG. 1. The plurality of horizontal access lines 207-1, 207-2, ..., 207-Q may be arranged (e.g., "stacked") along the third direction (D3) 211. The plurality of horizontal access lines 207-1, 207-2, ..., 207-Q may include a conductive material. For example, the conductive material may include one or more of a doped semiconductor (e.g., doped silicon, doped germanium, etc.), a conductive metal nitride (e.g., titanium nitride, tantalum nitride, etc.), a metal (e.g., tungsten (W), titanium (Ti), tantalum (Ta), ruthenium (Ru), cobalt (Co), molybdenum (Mo), etc.), and/or a metal-semiconductor compound (e.g., tungsten silicide, cobalt silicide, titanium silicide, etc.). Embodiments, however, are not limited to these examples.

Among each of the vertical levels, the horizontally oriented memory cells, e.g., memory cell 110 in FIG. 1, may be spaced apart from one another horizontally in the first direction (D1) 209. However, the plurality of discrete components to the horizontally oriented access devices 230 (e.g., first source/drain region 221 and second source/drain region 223 separated by a channel region 225) extending laterally in the second direction (D2) 205, and the plurality of horizontal access lines 207-1, 207-2, . . . , 207-Q extending laterally in the first direction (D1) 209, may be formed within different vertical layers within each level. For example, the plurality of horizontal access lines 207-1, 207-2, . . . , 207-Q, extending in the first direction (D1) 209, may be formed on a top surface opposing and electrically coupled to the channel regions 225, separated therefrom by a gate dielectric 204, and orthogonal to horizontally oriented access devices 230 (e.g., transistors) extending in laterally in the second direction (D2) 205. In some embodiments, the plurality of horizontal access lines 207-1, 207-2, . . . , 207-Q, extending in the first direction (D1) 209 are formed in a higher vertical layer, farther from the substrate 200, within a level (e.g., within level (L1)) than a layer in which the discrete components (e.g., first source/drain region 221 and second source/drain region 223 separated by a channel region 225) of the horizontally oriented access device are formed.

As shown in the example embodiment of FIG. 2, the sense lines, 203-1, 203-2, . . . , 203-Q, extend in a vertical direction with respect to the substrate 200 (e.g., in a third direction (D3) 211). Further, as shown in FIG. 2, the sense lines, 203-1, 203-2, . . . , 203-Q, in one sub cell array (e.g., sub cell array 101-2 in FIG. 1) may be spaced apart from each other in the first direction (D1) 209. The sense lines, 203-1, 203-2, . . . , 203-Q, may be provided, extending vertically relative to the substrate 200 in the third direction (D3) 211 in vertical alignment with source/drain regions to serve as first source/drain regions 221 or, as shown, be vertically adjacent first source/drain regions 221 for each of the horizontally oriented access devices 230 (e.g., transistors) extending laterally in the second direction (D2) 205, but adjacent to each other on a level (e.g., first level (L1)) in the first direction (D1) 209. Each of the sense lines, 203-1, 203-2, . . . , 203-Q, may vertically extend, in the third direction (D3), on sidewalls, adjacent first source/drain regions 221, of respective ones of the plurality of horizontally oriented access devices 230 (e.g., transistors) that are vertically stacked. In some embodiments, the plurality of vertical sense lines 203-1, 203-2, . . . , 203-Q, extending in the third direction (D3) 211, may be coupled to side surfaces of the first source/drain regions 221 directly and/or through additional contacts including metal silicides.

For example, and as shown in more detail in FIG. 2, a first one of the vertically extending sense lines (e.g., 203-1) may be adjacent a sidewall of a first source/drain region 221 to a first one of the horizontally oriented access devices 230 (e.g., transistors) in the first level, a sidewall of a first source/drain region 221 of a first one of the horizontally oriented access devices 230 (e.g., transistors) in the second level, and a sidewall of a first source/drain region 221 a first one of the horizontally oriented access devices 230 (e.g., transistors) in the third level, etc. Similarly, a second one of the vertically extending sense lines (e.g., 203-2) may be adjacent a sidewall to a first source/drain region 221 of a second one of the horizontally oriented access devices 230 (e.g., transistors) in the first level, spaced apart from the first one of horizontally oriented access devices 230 (e.g., transistors) in the first level in the first direction (D1) 209. And the second one of the vertically extending sense lines (e.g., 203-2) may be adjacent a sidewall of a first source/drain region 221 of a second one of the laterally oriented access devices 230 (e.g., transistors) in the second level, and a sidewall of a first source/drain region 221 of a second one of the horizontally oriented access devices 230 (e.g., transistors) in the third level, etc. Embodiments are not limited to a particular number of levels.

The vertically extending sense lines, 203-1, 203-2, . . . , 203-Q, may include a conductive material, such as, for example, one of a doped semiconductor material, a conductive metal nitride, metal, and/or a metal-semiconductor compound. The sense lines, 203-1, 203-2, . . . , 203-Q, may correspond to sense lines described in connection with FIG. 1.

As shown in the example embodiment of FIG. 2, an insulating material 295 may be formed extending in the first direction (D1) 209 along an end surface of the horizontally oriented access devices 230 (e.g., transistors) in each level above the substrate 200. The insulating material 295 may isolate memory cells on one side of the insulating material 295 from memory cells on a different side of the insulating material 295. The insulating material 295 may include, at least, a silicon oxide material, a silicon nitride material, a silicon oxynitride material, etc., or a combination thereof.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

Figure 3A:
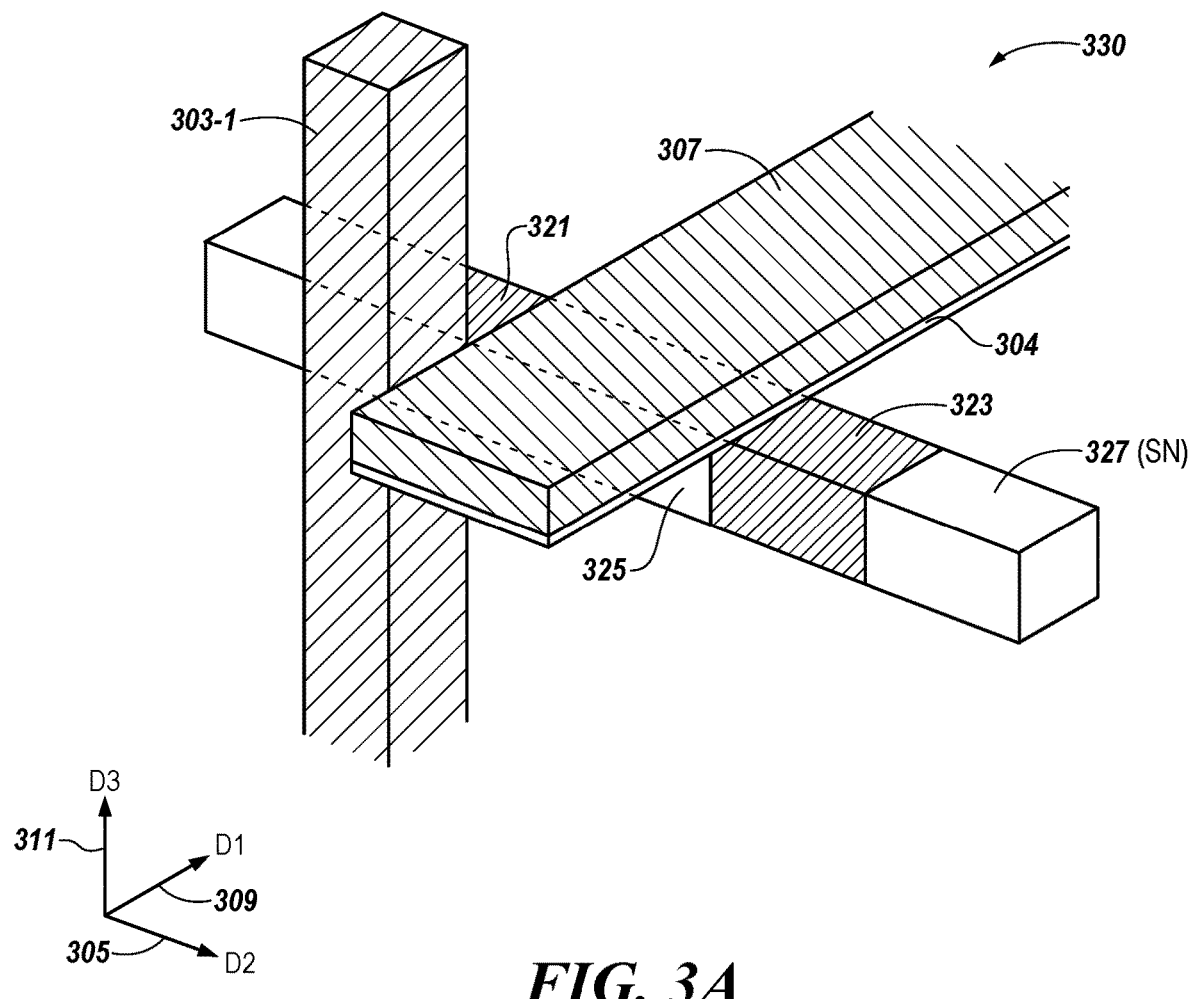
FIGS. 3A-3B are perspective views illustrating a channel and body region of a three-node access device for semiconductor devices, in accordance with a number of embodiments of the present disclosure.

FIG. 3A illustrates in more detail a memory cell of the vertically stacked array of memory cells (e.g., within a sub cell array 101-2 in FIG. 1) according to some embodiments of the present disclosure. As shown in FIG. 3A, the first and the second source/drain regions, 321 and 323, may be impurity doped regions to the laterally oriented access devices 330 (e.g., transistors). The first and the second source/drain regions, 321 and 323, may be analogous to the first and the second source/drain regions 221 and 223 shown in FIG. 2. The first and the second source/drain regions, 321 and 323, may be separated by a channel 325 formed in a body of semiconductor material (e.g., body region) of the horizontally oriented access devices 330 (e.g., transistors). The first and the second source/drain regions, 321 and 323, may be formed from an n-type or p-type dopant doped in the body region. A storage node 327 may be coupled to the second source/drain region 323. Embodiments are not so limited. A first direction (D1) 309, a second direction (D2) 305, and a third direction (D3) 311 are analogous to the first direction (D1) 209, the second direction (D2) 205, and the third direction (D3) 211 of FIG. 2, respectively.

For example, for an n-type conductivity transistor construction, the body region of the laterally oriented access devices 330 (e.g., transistors) may be formed of a low doped p-type (p−) semiconductor material. In one embodiment, the body region and the channel 325 separating the first and the second source/drain regions, 321 and 323, may include a low doped, p-type (e.g., low dopant concentration (p−)) polysilicon material consisting of boron (B) atoms as an impurity dopant to the polycrystalline silicon. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide (In$_2$O$_3$), or indium tin oxide (In$_{2-x}$Sn$_x$O$_3$), formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants (e.g., phosphorus (P), boron (B), etc.). Non-degenerate semiconductors, by contrast, contain moderate levels of doping, where the dopant atoms are well separated from each other in the semiconductor host lattice with negligible interaction.

In this example, the first and the second source/drain regions, 321 and 321, may include a high dopant concentration, n-type conductivity impurity (e.g., high dopant (n+)) doped in the first and the second source/drain regions, 321 and 323. In some embodiments, the high dopant, n-type conductivity first and second drain regions 321 and 323 may include a high concentration of phosphorus (P) atoms deposited therein. Embodiments, however, are not limited to this example. In other embodiments, the horizontally oriented access devices 330 (e.g., transistors) may be of a p-type conductivity construction in which case the impurity (e.g., dopant) conductivity types would be reversed.

As shown in the example embodiment of FIG. 3A, the first source/drain region 321 may occupy an upper portion in the body of the laterally oriented access devices 330 (e.g., transistors). For example, the first source/drain region 321 may have a bottom surface within the body of the horizontally oriented access device 330 which is located higher, vertically in the third direction (D3) 311, than a bottom surface of the body of the laterally, horizontally oriented access device 330. As such, the laterally, horizontally oriented transistor 330 may have a body portion which is below the first source/drain region 321 and is in electrical contact with the body contact. Further, as shown in the example embodiment of FIG. 3A, an access line (e.g., 307) analogous to the access lines 207-1, 207-2, . . . , 207-Q in FIGS. 2 and 107-1, 107-2, . . . , 107-Q shown in FIG. 1, may disposed on a top surface opposing and coupled to a channel region 325, separated therefrom by a gate dielectric 304. The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

As shown in the example embodiment of FIG. 3A, a sense line (e.g., 303-1) analogous to the sense lines 203-1, 203-2, . . . , 203-Q in FIGS. 2 and 103-1, 103-2, . . . , 103-Q in FIG. 1, may be vertically extending in the third direction (D3) 311 adjacent a sidewall of the first source/drain region 321 in the body to the horizontally oriented access devices 330 (e.g., transistors) horizontally conducting between the first and the second source/drain regions 321 and 323 along the second direction (D2) 305. In this embodiment, the vertical sense line 303-1 is formed asymmetrically adjacent in electrical contact with the first source/drain regions 321. The sense line 303-1 may be formed as asymmetrically to reserve room for a body contact in the channel region 325.

Figure 3B:
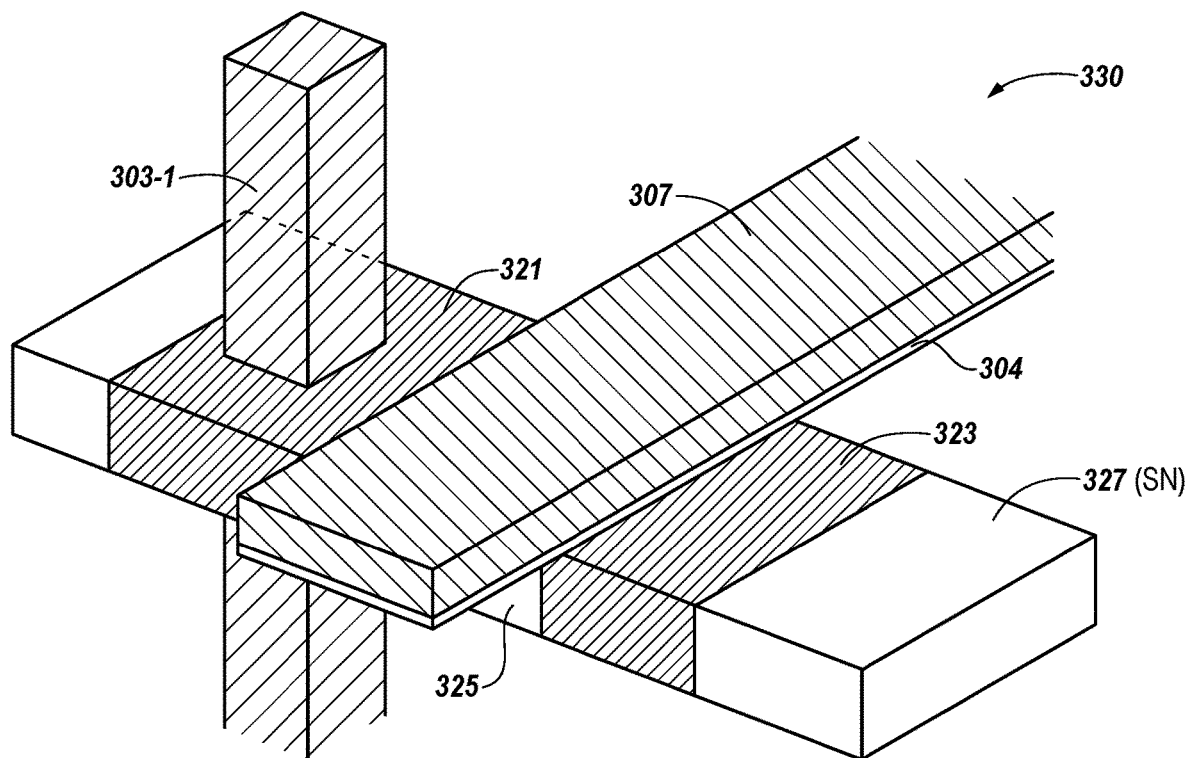

FIG. 3B illustrates in more detail a memory cell of the vertically stacked array of memory cells (e.g., within a sub cell array 101-2 in FIG. 1) according to some embodiments of the present disclosure. As shown in FIG. 3B, the first and the second source/drain regions, 321 and 323, may be impurity doped regions to the laterally oriented access devices 330 (e.g., transistors). The first and the second source/drain regions, 321 and 323, may be analogous to the first and the second source/drain regions 221 and 223 shown in FIG. 2 and the first and the second source/drain regions 321 and 323 shown in FIG. 3A. The first and the second source/drain regions may be separated by a channel 325 formed in a body of semiconductor material, e.g., body region, of the horizontally oriented access devices 330 (e.g., transistors). The first and the second source/drain regions, 321 and 323, may be formed from an n-type or p-type dopant doped in the body region. Embodiments are not so limited. A first direction (D1) 309, a second direction (D2) 305, and a third direction (D3) 311 are analogous to the first direction (D1) 209, the second direction (D2) 205, and the third direction (D3) 211 of FIG. 2, respectively.

As shown in the example embodiment of FIG. 3B, a sense line (e.g., 303-1) analogous to the sense lines 203-1, 203-2, . . . , 203-Q in FIGS. 2 and 103-1, 103-2, . . . , 103-Q in FIG. 1, may be vertically extending in the third direction (D3) 311 adjacent a sidewall of the first source/drain region 321 in the body to the horizontally oriented access devices 330 (e.g., transistors) horizontally conducting between the first and the second source/drain regions 321 and 323 along the second direction (D2) 305. In this embodiment, the vertical sense line 303-1 is formed symmetrically, in vertical alignment, in electrical contact with the first source/drain region 321. The sense line 303-1 may be formed in contact with an insulator material such that there is no body contact within channel 325.

As shown in the example embodiment of FIG. 3B, the sense line 303-1 may be formed symmetrically within the first source/drain region 321 such that the first source/drain region 321 surrounds the sense line 303-1 all around. The first source/drain region 321 may occupy an upper portion in the body of the laterally oriented access devices 330 (e.g., transistors). For example, the first source/drain region 321 may have a bottom surface within the body of the horizontally oriented access device 330 which is located higher, vertically in the third direction (D3) 311, than a bottom surface of the body of the laterally, horizontally oriented access device 330. As such, the laterally, horizontally oriented transistor 330 may have a body portion which is below the first source/drain region 321 and is in contact with the body contact. An insulator material may fill the body contact such that the first source/drain region 321 may not be in electrical contact with channel 325. Further, as shown in the example embodiment of FIG. 3B, an access line (e.g., 307-1) analogous to the access lines 207-1, 207-2, . . . , 207-Q in FIGS. 2 and 107-1, 107-2, . . . , 107-Q shown in FIG. 1, may disposed on a top surface opposing and coupled to a channel region 325, separated therefrom by a gate dielectric 304. A storage node 327 may be coupled to the second source/drain region 323.

Figure 3B:
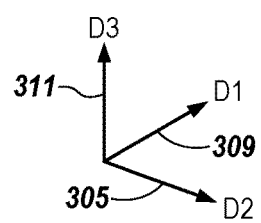
Figure 4:
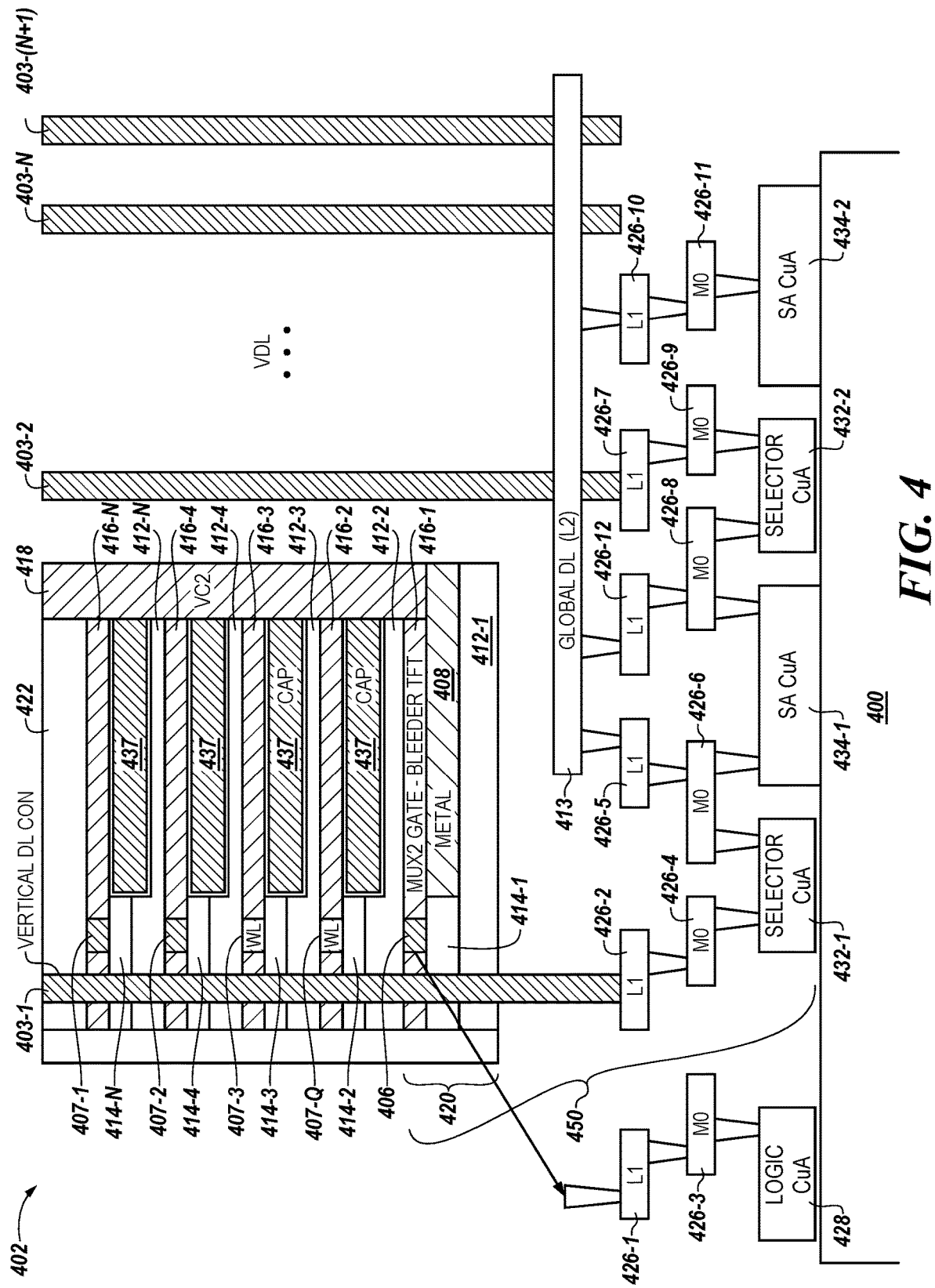
FIG. 4 is a cross-sectional view of a multiplexor for a semiconductor device, in accordance with a number of embodiments of the present disclosure.

FIG. 4 is a cross-sectional view of a multiplexor for a semiconductor device, in accordance with a number of embodiments of the present disclosure. As shown in FIG. 4, an array of memory cells can include a plurality of vertically stacked tiers of memory cells. The vertically stacked tiers of memory cells can include repeating, alternating layers of a first dielectric material 412-1, 412-2, 412-3, 412-4, . . . , 412-N, a semiconductor material 414-1, 414-2, 414-3, 414-4, . . . , 414-N, and a second dielectric material 416-1, 416-2, 416-3, 416-4, . . . , 416-N. In some embodiments, at least two (2) repeating iterations of the alternating layers may be formed to form the vertical stack 402 to a height in a range of twenty (20) nanometers (nm) to three hundred (300) nm. The layers of semiconductor material 414 can also be referred to as channels 414. In some embodiments, the first dielectric material 412, the semiconductor material 414, and the second dielectric material 416 may be formed using a chemical vapor deposition (CVD) process. In one embodiment, the first dielectric material 412 can be deposited to have a thickness (e.g., vertical height) in the third direction (D3), in a range of 20 nm to sixty (60) nm. In one embodiment, the semiconductor material 414 can be deposited to have a thickness (e.g., vertical height) in a range of ten (10) nm to thirty (30) nm. In one embodiment, the second dielectric material 416 can be deposited to have a thickness (e.g., vertical height), in a range of 20 nm to one hundred and fifty (150) nm. Embodiments, however, are not limited to these examples. As shown in FIG. 4, a vertical direction 411 is illustrated as a third direction (D3) (e.g., z-direction in an x-y-z coordinate system) analogous to the third direction (D3) among first, second, and third directions, shown in FIGS. 1-3. The vertical stack 402 can also include a dielectric cap 422.

In some embodiments, the first dielectric material 412 may be an interlayer dielectric (ILD). By way of example, and not by way of limitation, the first dielectric material 412 may comprise an oxide material, e.g., $SiO_2$. In another example the first dielectric material 412 may comprise a silicon nitride ($Si_3N_4$) material (also referred to herein as "SiN"). In another example the first dielectric material 412 may comprise a silicon oxy-carbide ($SiO_xC_y$) material. In another example the first dielectric material 412 may include silicon oxy-nitride ($SiO_xN_y$) material (also referred to herein as "SiON"), and/or combinations thereof. Embodiments are not limited to these examples.

In some embodiments, the second dielectric material 416 may be an interlayer dielectric (ILD). By way of example, and not by way of limitation, the second dielectric material 416 may comprise a nitride material. The nitride material may be a silicon nitride ($Si_3N_4$) material. In another example the second dielectric material 416 may comprise a silicon oxy-carbide (SiOC) material. In another example the second dielectric material 416 may include silicon oxy-nitride (SiON), and/or combinations thereof. Embodiments are not limited to these examples. However, according to embodiments, the second dielectric material 416 is purposefully chosen to be different in material or composition than the first dielectric material 412 such that a selective etch process may be performed on one of the first and second dielectric layers, selective to the other one of the first and the second dielectric layers (e.g., the second SiN dielectric material 416 may be selectively etched relative to the semiconductor material 414 and a first oxide dielectric material 412).

In some embodiments the semiconductor material 414 may comprise a silicon (Si) material in a polycrystalline and/or amorphous state. The semiconductor material 414 may be a low doped, p-type (p−) silicon material. The semiconductor material 414 may be formed by gas phase doping boron atoms (B), as an impurity dopant, at a low concentration to form the low doped, p-type (p−) silicon material. In some embodiments, the semiconductor material 416 may be formed by gas phase doping boron atoms (B) in-situ. The low doped, p-type (p−) silicon material may be an amorphous silicon material. Embodiments, however, are not limited to these examples.

In some embodiments, the array of memory cells can include a respective plurality of horizontal access lines coupled to each of the plurality of tiers of memory cells. The vertical stack 402 can include a sense line 403-1, 403-2, . . . , 403-N, 403-(N+1), and a plurality of access lines 407-1, 407-2, . . . , 407-Q. In some embodiments, the array of memory cells can include a plurality of vertical sense lines 403 coupled to each of the plurality of tiers of memory cells. The sense line 403 can be a vertical sense line that intersects and makes contact with each of the layers of the vertical stack 402. In some embodiments, the access lines 407 may be horizontal access lines 407 and may be formed in the semiconductor material 416 layers of the vertical stack 402.

In some embodiments, the array of memory cells can include a plurality of multiplexors 450 each coupled to a respective vertical sense line 403. Each of the plurality of multiplexors 450 can include a respective first portion 420 and a respective second portion (e.g., selector circuitry) 432-1, 432-2. As used herein, the term "multiplexor" refers to circuitry to select one of multiple vertical and/or horizontal sense lines. The first portion 420 of each multiplexor 450 can be formed separately from the second portion 432 of each multiplexor 450. In some embodiments, the respective first portion 420 of the multiplexor 450 can be coupled to the array of memory cells and configured to couple the vertical sense line 403 to a vertical portion of a storage node 418. In some embodiments, the respective second portion 432 of the multiplexor can be formed on a substrate material 400 and configured to electrically couple the respective vertical sense line 403 to a horizontal sense line 413. In some embodiments, the respective first portion 420 of each multiplexor 450 can be coupled between the plurality of vertically stacked tiers and the respective horizontal sense line 413 via the respective vertical sense line 403.

In some embodiments, the first portion 420 of the multiplexor 450 can include the first dielectric material 412-1, the semiconductor material 414-1, the second dielectric material 416-1, and the sense line 403-1 (e.g., local sense line) of the vertical stack 402. However, instead of access lines (e.g., access lines 407), the first portion 420 of the multiplexor 450 can include a multiplexor switch 406 formed in the semiconductor material 416. In some embodiments, the multiplexor switch 406 may be formed in an area of the semiconductor material 416 corresponding to an area of the semiconductor material 416 in which the access lines 407 are formed, such that the multiplexor switch 406, specifically a gate of the multiplexor switch 406, is in a vertical alignment with the access lines 407. The multiplexor switch 406 comprises a gate, a first terminal, and a second terminal. The first terminal of the multiplexor switch 406 is coupled to the respective vertical sense line 403 and the second terminal of the multiplexor switch 406 is coupled to a metal fill 408.

As shown in FIG. 4, the metal fill 408 is formed in a location corresponding to the horizontal portions of other storage nodes 437. In some embodiments, the metal fill 408 can run parallel to and vertically in line with a plurality of horizontal portions of the storage nodes 437. As shown in FIG. 4, the metal fill 408 can be coupled to a vertical portion of the storage node 418. As shown in FIG. 4, the multiplexor switch 406 can be below the access lines 407. "Below the access lines 407" means that the multiplexor switch 406 is closer to the substrate material 400 than the access lines 407 are. The first layer of semiconductor material 414-1 can function as a channel for the multiplexor switch 406. Subsequent layers of the semiconductor material (e.g., semiconductor material 414-2, 414-3, . . . , 414-N) can function as channels for memory cells, which include the storage nodes 437 (e.g., memory cell 110 in FIG. 1).

As shown in FIG. 4, the array of memory cells can include semiconductor under the array (SuA) circuitry comprising a plurality of sense amplifiers (sense amps) 434-1, 434-2 (individually or collectively referred to as sense amps 434), each sense amp coupled to a respective subset of the plurality of multiplexors. SuA circuitry can also be referred to as CuA circuitry, which stands for complementary metal oxide semiconductor (CMOS) under the array circuitry, however embodiments are not so limited. In some embodiments, the SuA circuitry can include control circuitry (e.g., logic CuA) 428 coupled to a multiplexor switch 406 of each of the plurality of multiplexors and configured to cause the respective multiplexor switches 406 to electrically couple the respective vertical sense line 403 to the respective horizontal sense line 407. The vertical sense line 403 can couple to the control circuitry 428, the second portion 432 of the multiplexor 450, and the sense amp 434 through conductive lines 426-1, 426-2, . . . , 426-12.

As shown in FIG. 4, the horizontal sense line 413 (e.g., global digit line (DL)) can be coupled to the SuA circuitry including a second portion 432 of the multiplexor 450 (e.g., selector SuA circuitry). Further, the respective vertical sense line 403 can be coupled to the second portion 432 of the multiplexors 450. In some embodiments, the horizontal sense line 413 can be coupled to the plurality of sense amps 434. Each vertical sense line can be coupled to separate second portions 432 of the multiplexor 450. Each of the plurality of sense amps can be coupled to a plurality of vertical sense lines 403 through a single horizontal sense line 413. Further, each sense amp 434 is coupled to a plurality of second portions 432 of the multiplexor 450.

The first portion 420 of the multiplexor 450 and the second portion 432 of the multiplexor 450 can be included in a memory device. A method for operating the memory device can include activating a vertical sense 403 coupled to a vertical stack of the memory device to store data in a memory cell of the vertical stack. The method can include selecting the vertical sense line 403 by activating the vertical sense line 403 and deselecting a vertical sense line 403 by activating a multiplexor switch 406. The method for operating the memory device can also include activating a second portion 432 of a multiplexor 450 coupled to the vertical stack to transfer the stored data to a horizontal sense line 413, wherein the second portion 432 of the multiplexor 450 is selector circuitry coupled SuA circuitry coupled to the vertical sense line 403 and the horizontal sense line 413. The method for operating the memory device can also include activating a multiplexor switch 406 of a first portion 420 of the multiplexor 450, wherein a first terminal (e.g., first terminal 738-1 in FIG. 7A) of the multiplexor switch 406 is coupled to the vertical sense line 403 and a second terminal (e.g., second terminal 738-2 in FIG. 7A) of the multiplexor switch 406 is coupled to a vertical portion of a storage node 418 of the vertical stack. In some embodiments, the vertical sense line 403 can extend below the first portion 420 of the multiplexor 450 and couple to the second portion 432 of the multiplexor 450.

Figure 5:
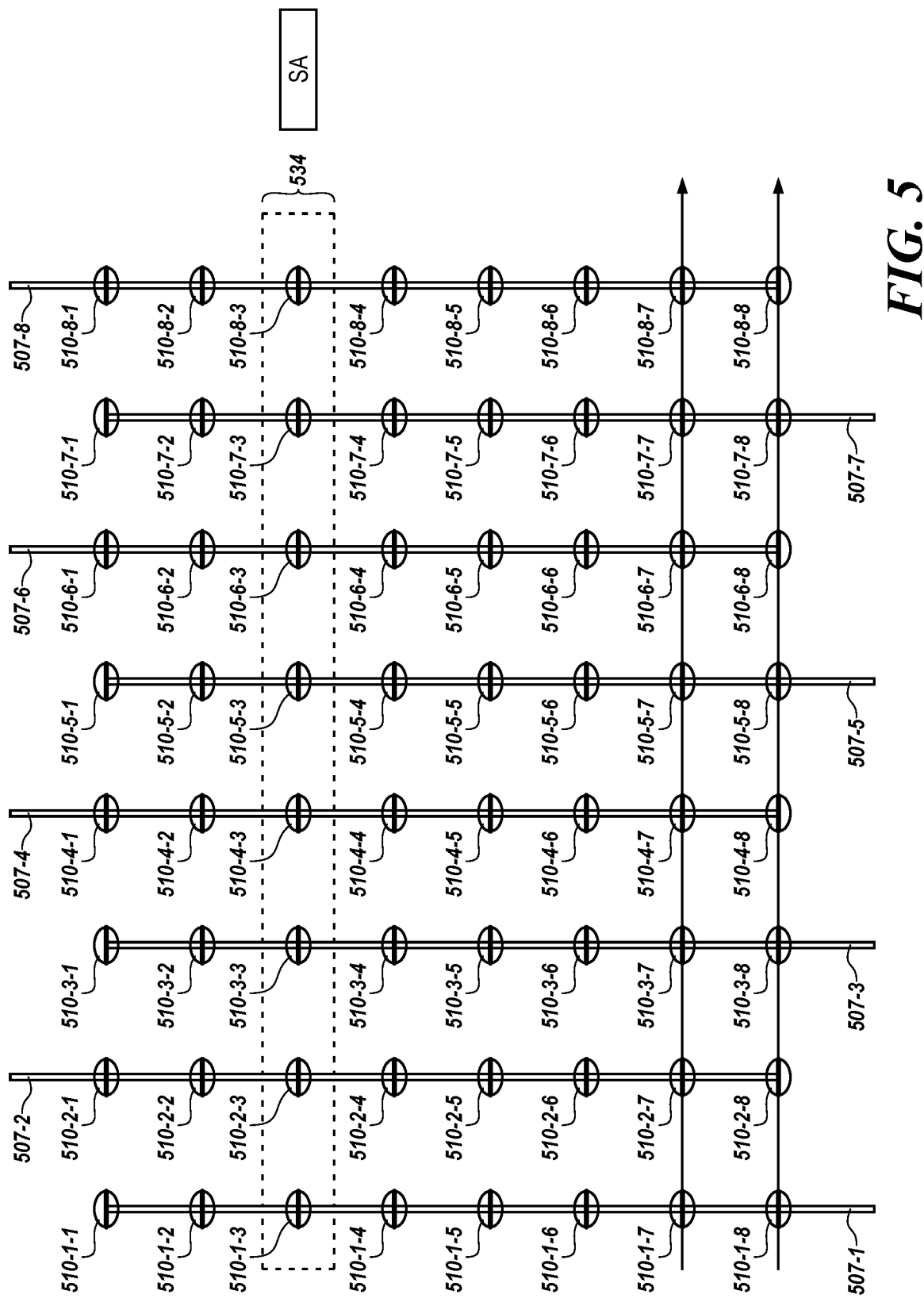
FIG. 5 is a top-down view of an array of memory cells, in accordance with a number of embodiments of the present disclosure.

FIG. 5 is a top-down view of an array of memory cells, in accordance with a number of embodiments of the present disclosure. As shown in FIG. 5, the array of memory cells can include a plurality of memory cells 510-1-1, . . . , 510-1-8, . . . , 510-8-1, . . . , 510-8-8 (individually or collectively known as memory cells 510), a plurality of access lines 507-1, 507-2, . . . , 507-8, and sense amp circuitry 534. In some embodiments, a memory cell 510 can be in the same location as a vertical sense line contact.

In some embodiments, a sense amp 534 can occupy more space than a single memory cell 510. Therefore, multiple memory cells 510 and vertical sense lines (e.g., vertical sense line 403 in FIG. 4) can share a single sense amp 534. In the embodiment shown in FIG. 5, eight (8) memory cells 510 are coupled to a single sense amp 534. A sense amp 534 can be coupled to multiple vertical sense lines through a single horizontal sense line (e.g., horizontal sense line 413 in FIG. 4). In some embodiments, sub-access line drivers can be coupled to the access lines 507 to drive voltage to the access lines 507.

The memory cells 510 in the array of memory cells can be sensed. A method of sensing a memory cell in the array of memory cells can include activating a particular horizontal access line 507 coupled to the memory cell 510, wherein the particular horizontal access line 507 is one of a plurality of respective horizontal access lines 507. The method of sensing a memory cell 510 in the array of memory cells 510 can include electrically coupling a vertical sense line (e.g., vertical sense line 403 in FIG. 4) to a horizontal sense line (e.g., horizontal sense line 413 in FIG. 4) via a second portion of a multiplexor in the array of memory cells 510, wherein the second portion of the multiplexor is selector semiconductor under the array (SuA) circuitry and the vertical sense line is coupled to the memory cell 510. Electrically coupling the vertical sense line to the horizontal sense line can comprise applying a voltage to the vertical sense line coupled to the second portion of the multiplexor. As previously stated, the second portion of the multiplexor is coupled to the horizontal sense line. Further, the method of sensing the memory cell can include sensing the memory cell with a sense amp in the SuA circuitry, wherein the sense amp is coupled to the horizontal sense line.

Figure 6:
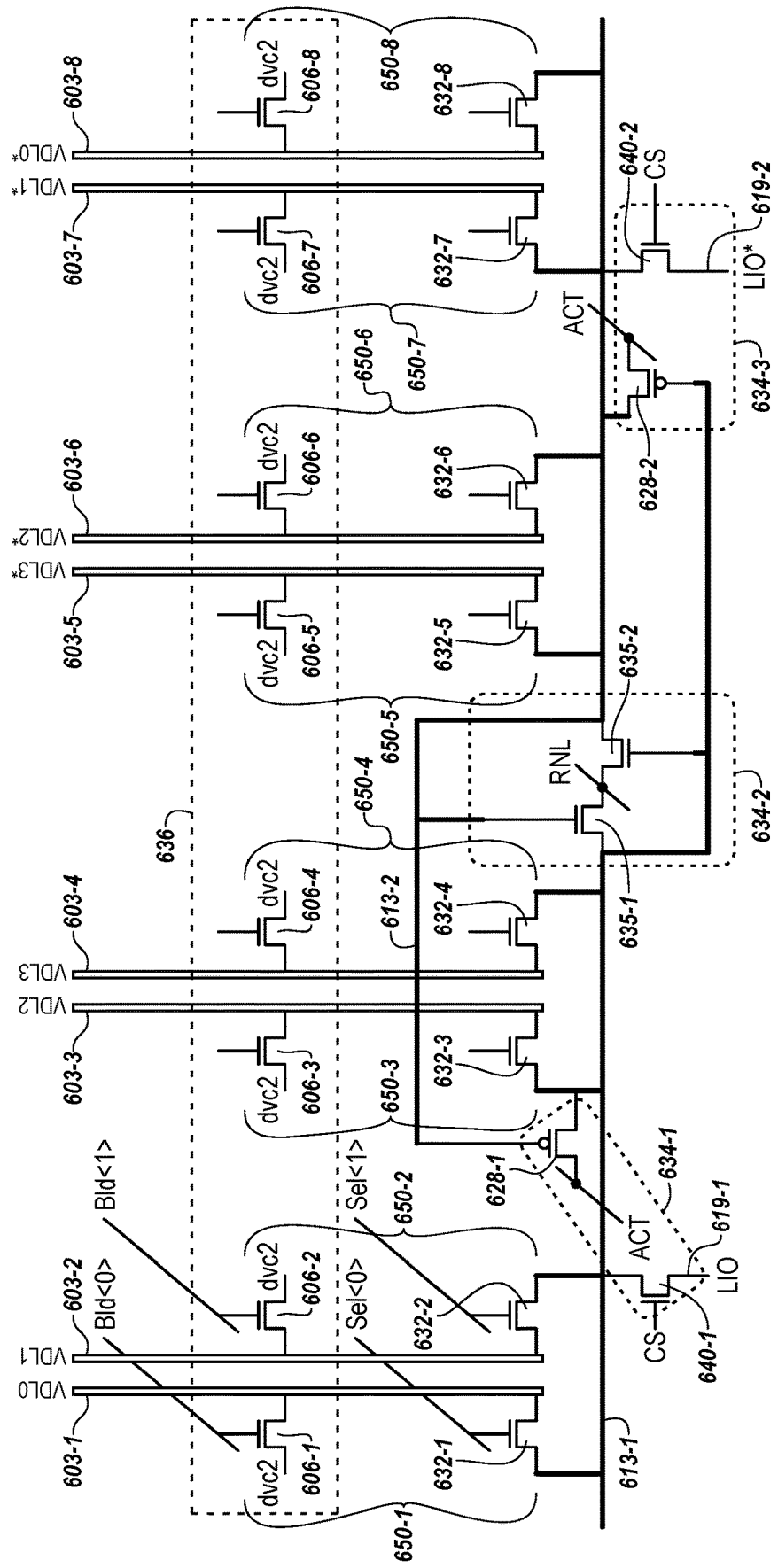
FIG. 6 is a schematic view of a plurality of multiplexors for a semiconductor device, in accordance with a number of embodiments of the present disclosure.

FIG. 6 is a schematic view of a plurality of multiplexors for a semiconductor device, in accordance with a number of embodiments of the present disclosure. FIG. 6 includes a plurality of vertical sense lines 603, a plurality of multiplexor switches 606, a plurality of second portions 632 of a multiplexors 650-1, 650-2, . . . , 650-8 (individually or collectively referred to as multiplexor 650), a plurality of horizontal sense lines 613, column select circuitry 640, and input/output (I/O) circuitry 619. Vertical sense lines 603-5, 603-6, 603-7, 603-8 can be reference vertical sense lines and horizontal sense line 613-2 can be a reference horizontal sense line.

As shown in FIG. 6, the multiplexor switches 606 can be coupled to respective vertical sense lines 603. Second portions 632 of the multiplexor 650 can be coupled to respective vertical sense lines 603. Respective second portions 632 of the multiplexor 650 can be coupled to the same respective sense lines 603 as the multiplexor switch. For example, as shown in FIG. 6, multiplexor switch 606-1 and second portion 632-1 of the multiplexor 650-1 can be coupled to the same vertical sense line 603. The second portion 632 of the multiplexor 650 can be coupled to a lower part of the respective vertical sense line 603 than the multiplexor switch 606. The multiplexor switch 606 can be included in a first portion of a multiplexor (e.g., first portion 420 of the multiplexor 450 in FIG. 4). The area 636 indicates an area wherein the memory components are a part of the vertical stack (e.g., vertical stack 402 in FIG. 4). Multiplexor switches 606 are within the area 636, indicating that the multiplexor switches 606 are a part of the vertical stack.

FIG. 6 illustrates distributed sense amp circuitry 634-1, 634-2, 634-3 (individually or collectively referred to as break out sense amp 634). As used herein, the term "distributed sense amp" refers to a sense amp that has been separated into multiple, separate parts. A first portion of the distributed sense amp circuitry 634-1 can include a first column select transistor 640-1 and a first transistor 628-1. The first column select transistor 640-1 has a gate configured to receive a column select signal, a first terminal coupled to I/O circuitry 619-1 and a second terminal coupled to the first horizontal sense line 613-1. The first transistor 628-1 has a gate coupled to a second horizontal sense line 613-2 (e.g., a reference horizontal sense line), a first terminal configured to receive an activation signal ("ACT"), and a second terminal coupled to the first horizontal sense line 613-1.

A second portion 634-2 of the distributed sense amp can include two transistors 635-1, 635-2. The second portion 634-2 of the distributed sense amp 634 can receive a latch signal "RNL" to cause the sense amp 634 to lock in a value of a signal. A first terminal of each of the transistors 635-1, 635-2 can be configured to receive the RNL signal. A second terminal of the first transistor 635-1 is coupled to the first horizontal sense line 613-1. A second terminal of the second transistor 635-2 is coupled to the second horizontal sense line 613-2. As used herein, the term "lock in" refers to setting a value of a signal such that the value does not change unless instructions are sent to change the value of the signal.

A third portion of the distributed sense amp 634-3 can include a second column select transistor 640-2 and a second transistor 628-2. The second column select transistor 640-2 can have a gate configured to receive a column select signal, a first terminal coupled to I/O circuitry 619-2 and a second terminal coupled to the second horizontal sense line 613-2. The second transistor 628-2 can have a gate coupled to the first horizontal sense line 613-1, a first terminal configured to receive an activation signal ("ACT"), and a second terminal coupled to the second horizontal sense line 613-2. Each portion of the distributed sense amp 634 can be built on a substrate (e.g., substrate 400 in FIG. 4).

Figure 7A:
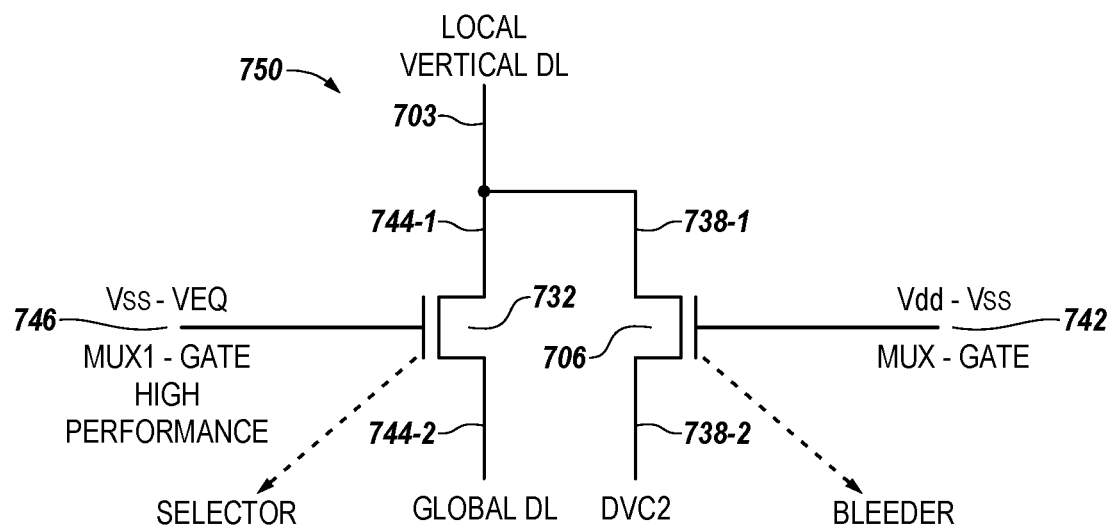
FIG. 7A is a schematic view of a multiplexor for a semiconductor device, in accordance with a number of embodiments of the present disclosure.

FIG. 7A is a schematic view of a multiplexor for a semiconductor device, in accordance with a number of embodiments of the present disclosure. The first portion of the multiplexor (e.g., first portion 420 of the multiplexor 450 in FIG. 4) can be formed under an array of memory cells comprising a plurality of vertically stacked tiers of memory cells, such as is illustrated in FIG. 4. The array can include a plurality of vertical sense lines, such as the vertical sense line 703 illustrated in FIG. 7A, coupled to the tiers of memory cells. Each vertical sense line can be coupled to a respective first and second portion of the multiplexor 750. For a subset of vertical sense lines, the respective first and second portions of the multiplexors 750 function to select and/or deselect (electrically couple/decouple) the vertical sense lines to/from a horizontal sense line, such as the horizontal sense line. The subset of vertical sense lines 703 can be those vertical sense lines coupled to the particular horizontal sense line, where the particular horizontal sense line is one of a plurality of horizontal sense lines under the array. The horizontal sense line can be coupled to a positive power supply. For example, each horizontal sense line 713 under the array can be coupled to a respective sense line driver.

The first portion of the multiplexor 750 (e.g., first portion 420 of the multiplexor 450 in FIG. 4) can include a multiplexor switch (e.g., transistor) 706 coupled to a vertical sense line 703. The multiplexor switch 706 of the first portion of the multiplexor 750 can include a gate 742, a first terminal 738-1 coupled to the vertical sense line 703, and a second terminal 738-2 coupled to a vertical portion of a storage node (e.g., vertical portion of a storage node 418 in FIG. 4). The second portion 732 of the multiplexor 750 can include a transistor (e.g., selector circuitry) 732. The second portion 732 of the multiplexor 750 can include a gate 742, a first terminal 744-1 coupled to the vertical sense line 703, and a second terminal 744-2 coupled to a horizontal sense line (e.g., horizontal sense line 413 in FIG. 4).

The first portion of the multiplexor 750 can be configured such that deactivation of the second portion 732 of the multiplexor 750 and activation of the multiplexor switch 706 of the first portion of the multiplexor 750 causes the respective vertical access line 703 to be electrically coupled to the vertical portion of a storage node (e.g., vertical portion of a storage node 418 in FIG. 4). To activate the first portion of the multiplexor 750, a signal equivalent to a signal from the negative power supply ("Vdd") can be applied to a gate 742 of the first transistor 706. To activate the second transistor 732, a signal ("Vdd") equivalent to a signal from the negative power supply can be applied to a gate 746 of the second transistor 732. Applying a signal from the negative power supply is also referred to in the art as "resetting" the sense line.

The second portion 732 of the multiplexor 750 can be configured such that activation of the second portion (e.g., transistor) 732 of the multiplexor 750 and deactivation of the first portion 720 of the multiplexor 750 causes the respective vertical sense line 703 to be electrically coupled to the horizontal sense line. To activate the second portion 732 of the multiplexor 750, a signal ("Vss") can be applied to the gate 746 of the second portion 732 of the multiplexor 750. To deactivate the first portion of the multiplexor 750, a signal ("Vss") can be applied to the gate 746 of the second portion 732 of the multiplexor 750.

Although not specifically illustrated in FIG. 7A, a control circuit can be coupled to the multiplexor switch 706 and configured to apply to the gate 742 at a particular time, any one of a negative supply voltage ("Vss"), a positive supply voltage ("Vdd"), and a positive supply voltage plus a threshold voltage of the multiplexor switch 706. A control circuit can be coupled to the second portion 732 of the multiplexor 750 and configured to apply to the gate 746 at a particular time, any one of a negative supply voltage ("Vss") and a voltage ("Vdd") greater than the negative supply voltage ("Vss"). In some embodiments, the voltage greater than the negative supply voltage can be at least one threshold voltage greater than the negative supply voltage.

Although not specifically illustrated, the first portion of the multiplexor 750 can be coupled to control circuitry. The control circuitry can be configured to simultaneously cause the second portion 732 of the multiplexor 750 to electrically couple the vertical sense line 703 to the horizontal sense line (e.g., horizontal sense line 413 in FIG. 4) and to cause the plurality of additional second portions 732 of the multiplexors 750 to electrically decouple the plurality of additional vertical sense lines from the horizontal access line. The control circuitry can be further configured to simultaneously activate a horizontal access line coupled to a particular memory cell in a particular tier of memory cells. The particular memory cell is also coupled to the vertical sense line 703.

Figure 7B:
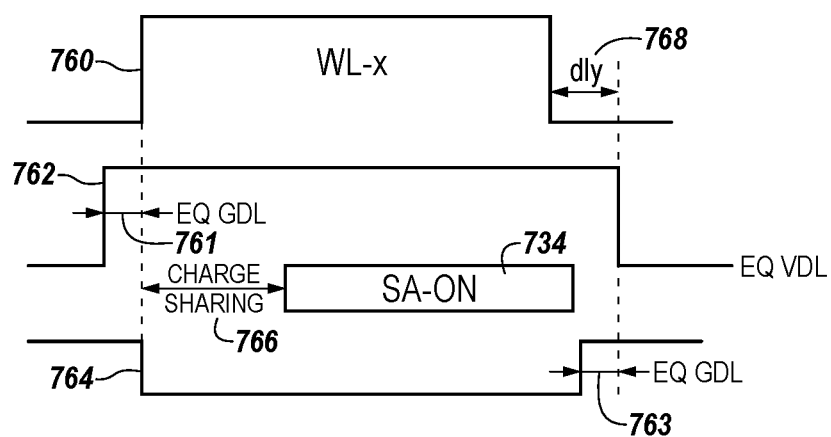
FIG. 7B is a timing diagram for a semiconductor device, in accordance with a number of embodiments of the present disclosure.

FIG. 7B is a timing diagram for a semiconductor device, in accordance with a number of embodiments of the present disclosure. In FIG. 7B, the waveform 762 represents a signal applied to the gate 746 of the second portion 732 of the multiplexor 750 illustrated in FIG. 7A. During a first period of time 761, a horizontal sense line (e.g., horizontal sense line 413 in FIG. 4) can be equilibrated to the vertical sense line. As used herein, the term "equilibrate" refers to bringing two or more conductive lines into equilibrium with each other. Once the horizontal sense line is equilibrated with the vertical sense line, a signal applied to a horizontal access line (e.g., horizontal access line 407 in FIG. 4) can be activated, which may also be referred to as being turned on or going high, as shown by waveform 760. Further, once the horizontal sense line is equilibrated to the vertical sense line, a signal applied to the gate 742 of the multiplexor switch 706 illustrated in FIG. 7A can be deactivated, which may also be referred to as being turned off or going low (e.g., the bleeder resistor can be disconnected from the vertical sense line) as shown in waveform 764.

The period of time 766 represents an amount of time for a horizontal access line to remain on to allow charge to flow from the selected memory cell through the vertical sense line and the horizontal sense line, after which the sense amp 734 is activated or turned on. A delay 768 occurs while the sense amp 734 is still activated between turning off the horizontal access line (as indicated by the waveform 760 going low) and disconnecting the vertical sense line from the horizontal sense line (as indicated by the waveform 762 going low). During the delay 768, the sense amp 734 is deactivated and the signal applied to the gate of the multiplexor switch 706 goes high (as indicated by the waveform 764) to reconnect the vertical sense line to the bleeder. There is a time period 763 between activating the multiplexor switch 706 and deactivating the second portion 732 of the multiplexor 750 during which both gates 746, 742 are driven high to equilibrate the horizontal sense line to the vertical sense line, which has been disconnected from the horizontal access line, but connected to the bleeder.

Figure 8:
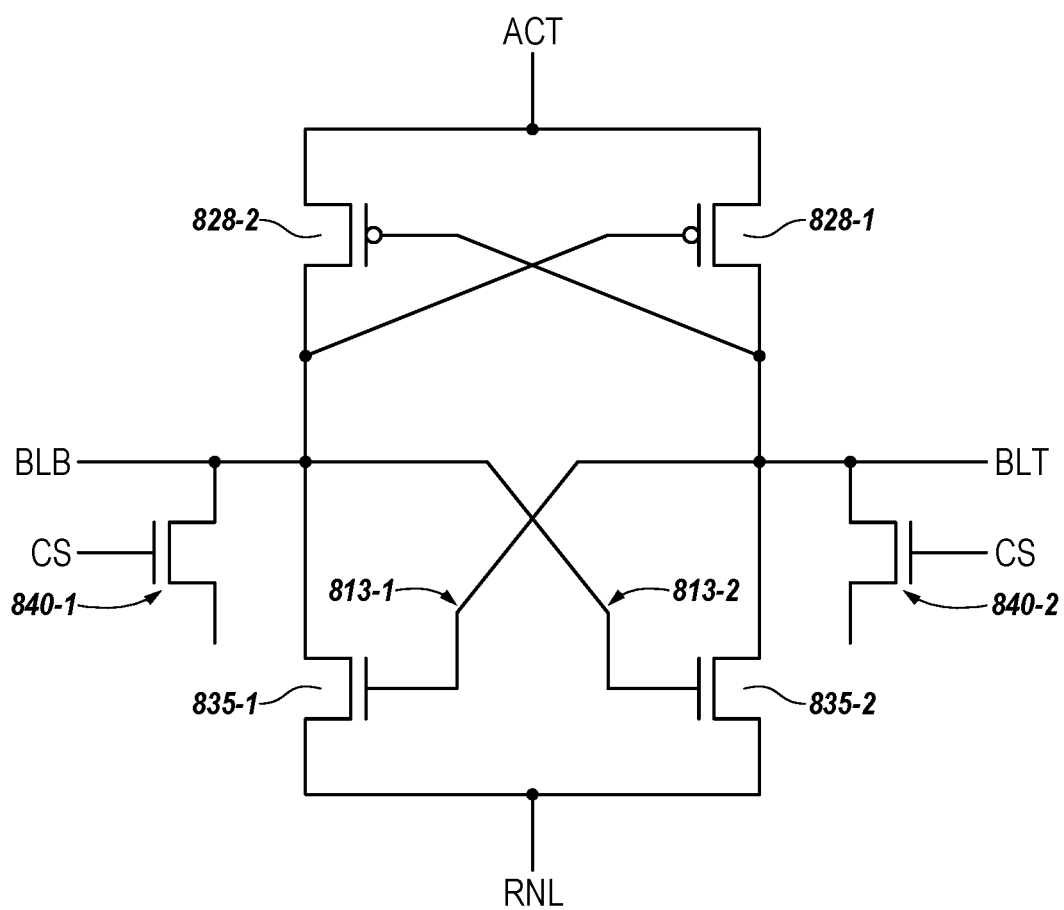
FIG. 8 is a schematic view of a sense amplifier for a semiconductor device, in accordance with a number of embodiments of the present disclosure

FIG. 8 is a schematic view of a sense amplifier (e.g., sense amp 634 in FIG. 6) for a semiconductor device, in accordance with a number of embodiments of the present disclosure. Whereas FIG. 6 illustrates the physical layout of the distributed sense amplifier, FIG. 8 illustrates the sense amplifier schematically. The sense amplifier 834 in FIG. 8 includes a first column select transistor 840-1, second column select transistor 840-2, first transistor 828-1, second transistor 828-2, two transistors 835-1, 835-2, a first horizontal sense line 813-1, and a second horizontal sense line 813-2.

As shown in FIG. 8, a terminal of the first column select transistor 840-1 is coupled to the first horizontal sense line 813-1. A terminal of the second column select transistor 840-2 is coupled to the first horizontal sense line 813-1. The second horizontal sense line 813-2 can also be coupled to a gate of the transistor 835-2. The first horizontal sense line 813-1 can also be coupled to a gate of the first transistor 835-1. The first terminal of the first transistor 835-1 and the first terminal of the second transistor 835-2 can be configured to receive the RNL signal. A second terminal of the first transistor 835-1 can be coupled to the second horizontal sense line 813-2 and a second terminal of the second transistor 835-2 can be coupled to a first horizontal sense line 813-1.

A first terminal of first transistor 828-1 and a first terminal of second transistor 828-2 can be configured to receive the ACT signal. The second terminal of the first transistor 828-1 can be coupled to the first horizontal sense line 813-1 and a second terminal of the second transistor 828-2 can be coupled to a second horizontal sense line 813-2. The gate of the first transistor 828-1 can be coupled to the second horizontal sense line 813-2. The gate of the second transistor 828-2 can be coupled to the first horizontal sense line 813-1.

Figure 9:
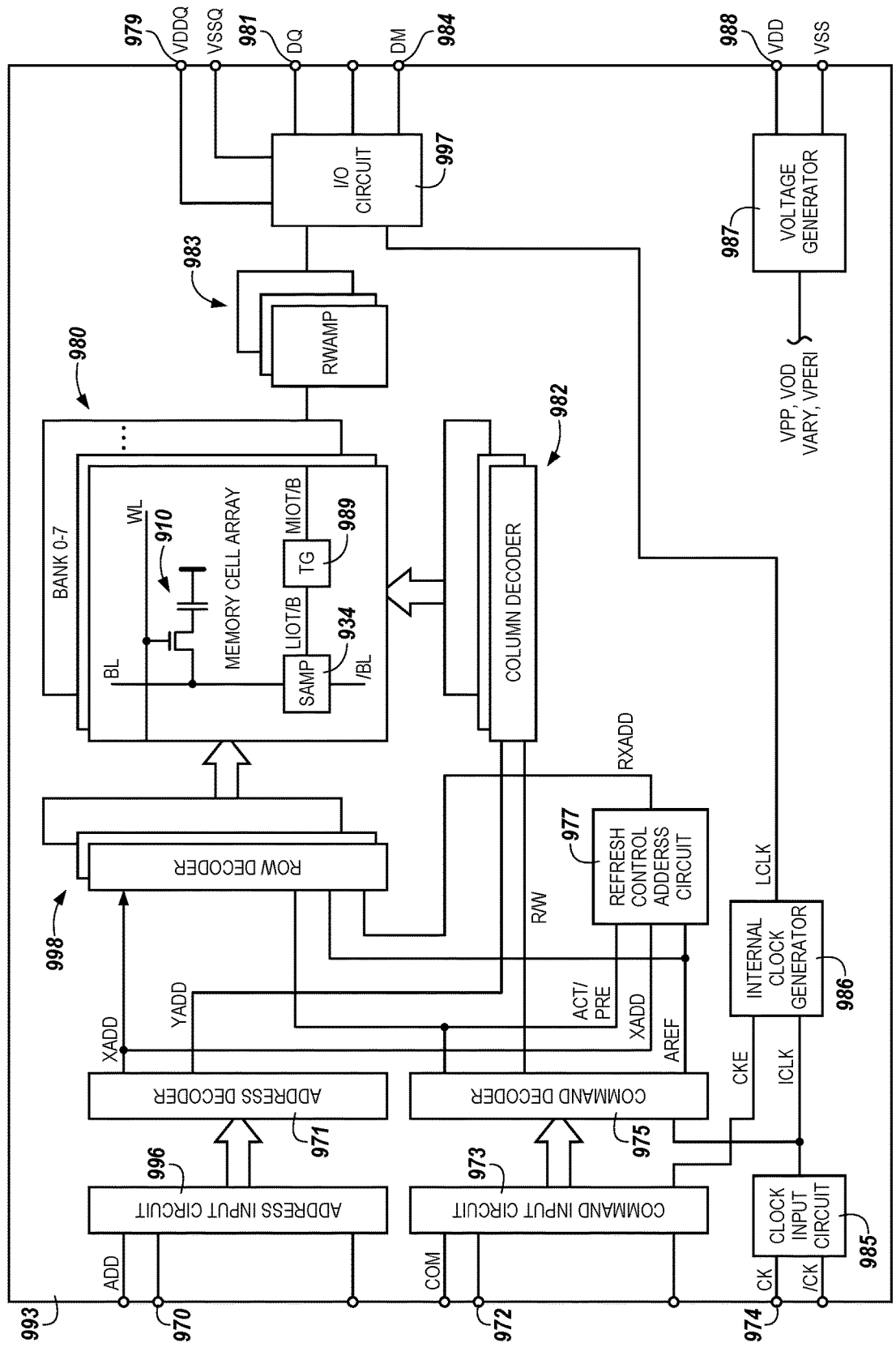
FIG. 9 is a block diagram of an apparatus in the form of a computing system including a memory device, in accordance with a number of embodiments of the present disclosure.

FIG. 9 is a block diagram of an apparatus in the form of a computing system including a memory device 993 in accordance with a number of embodiments of the present disclosure. As used herein, a memory device 993, a memory array 980, and/or a host (not pictured), for example, might also be separately considered an "apparatus."

In this example, system 990 includes a host (not pictured) coupled to memory device 993 via an interface. The computing system can be a personal laptop computer, a desktop computer, a digital camera, a mobile telephone, a memory card reader, or an Internet-of-Things (IoT) enabled device, among various other types of systems. The host can include a number of processing resources (e.g., one or more processors, microprocessors, or some other type of controlling circuitry) capable of accessing the memory device 993. The system can include separate integrated circuits, or both the host and the memory device 993 can be on the same integrated circuit. For example, the host may be a system controller of a memory system comprising multiple memory devices 993, with the system controller (not pictured) providing access to the respective memory devices 993 by another processing resource such as a central processing unit (CPU).

In the example shown in FIG. 9, the host is responsible for executing an operating system (OS) and/or various applications (e.g., processes) that can be loaded thereto (e.g., from memory device 993 via a controller). The OS and/or various applications can be loaded from the memory device 993 by providing access commands from the host to the memory device 993 to access the data comprising the OS and/or the various applications. The host can also access data utilized by the OS and/or various applications by providing access commands to the memory device 993 to retrieve said data utilized in the execution of the OS and/or the various applications.

For clarity, the system has been simplified to focus on features with particular relevance to the present disclosure. The memory array 980 can be a DRAM array comprising at least one memory cell 910 having a sense line and body contact formed according to the techniques described herein. For example, the memory array 980 can be an unshielded DL 4F2 array such as a 3D-DRAM memory array. The memory array 980 can comprise memory cells 910 arranged in rows coupled by access lines (which may be referred to herein as word lines or select lines) and columns coupled by sense lines (which may be referred to herein as digit lines or data lines), a sense amp 934 and transfer gates 989 that can function as switches. Sense amp 934 may be provided for corresponding sense lines and connected to at least one respective local input/output (I/O) line pair (LIOT/B), which may in turn be coupled to at least respective one main I/O line pair (MIOT/B), via the transfer gates 989. Memory device 993 may include a number of arrays 980 (e.g., a number of banks of DRAM cells).

The memory device 993 includes address input circuitry 996 to latch address signals provided over an address bus (e.g., interface) 970. An interface can include, for example, a physical interface employing a suitable protocol (e.g., a data bus, an address bus, and a command bus, or a combined data/address/command bus). Such protocol may be custom or proprietary, or the interface may employ a standardized protocol, such as Peripheral Component Interconnect Express (PCIe), Gen-Z, CCIX, or the like. Address signals are received and decoded by an address decoder 971, a row decoder 998 and a column decoder 982 to access the memory array 980. Data can be read from memory array 980 by sensing voltage and/or current changes on the sense lines using sensing circuitry (not pictured). The sensing circuitry can comprise, for example, sense amplifiers 934 that can read and latch a page (e.g., row) of data from the memory array 980. The I/O circuitry 997 can be used for bi-directional data communication with the host over a first voltage bus 979, a first data bus 981, and a second data bus 984. The read/write circuitry (read/write amplifier) 983 is used to write data to the memory array 980 or read data from the memory array 980. As an example, the read/write circuitry 983 can comprise various drivers, latch circuitry, etc.

Control circuitry (not pictured) includes registers and decodes signals provided by the host. The signals can be commands provided by the host. Command input circuitry 973 can receive a command over a command bus 972 and the command can be decoded by command decoder circuitry 975. Although the address input circuitry 996 and the command input circuitry 973 are shown as separate circuits, the address input circuitry 996 and the command input circuitry 973 can be combined into a single circuit. These signals can include chip enable signals, write enable signals, and address latch signals that are used to control operations performed on the memory array 980, including data read operations, data write operations, and data erase operations. The memory device 993 can also include refresh address control circuitry 977 to refresh data in the memory device 993. In various embodiments, the control circuitry is responsible for executing instructions from the host. The control circuitry can comprise a state machine, a sequencer, and/or some other type of control circuitry, which may be implemented in the form of hardware, firmware, or software, or any combination of the three. In some examples, the host can be a controller external to the memory device 993. For example, the host can be a memory controller which is coupled to a processing resource of a computing device.

The memory device 993 can also include clock input circuitry 985 to receive external clock signals over a clock bus 974. The memory device 993 can also include internal clock generator 986 to generate an internal clock signal. Further, the memory device 993 can include an internal voltage generator 987 to generate various internal voltage potentials based on the power supply potentials VDD and VSS and a second voltage bus 988 to send a receive a voltage.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A memory device, comprising:
  an array of memory cells comprising:
    a plurality of vertically stacked tiers of memory cells;
    a respective plurality of horizontal access lines coupled to each of the plurality of tiers of memory cells;
    a plurality of vertical sense lines coupled to each of the plurality of tiers of memory cells; and
    a plurality of multiplexors each coupled to a respective vertical sense line, wherein:
      each of the plurality of multiplexors includes a respective first portion and a respective second portion;
      the respective first portion is coupled to the array of memory cells and configured to couple a vertical sense line to a vertical portion of a storage node; and
      the respective second portion is formed on a substrate material and configured to electrically couple the respective vertical sense line to a horizontal sense line; and semiconductor under the array (SuA) circuitry comprising a plurality of sense amplifiers, each sense amplifier coupled to a respective subset of the plurality of multiplexors.

2. The memory device of claim 1, wherein the respective first portion of each multiplexor is coupled between the plurality of vertically stacked tiers and the respective horizontal sense line via the respective vertical sense line.

3. The memory device of claim 1, wherein the SuA circuitry further comprises control circuitry coupled to respective multiplexor switches of each of the plurality of multiplexors and configured to cause the respective multiplexor switches to electrically couple the respective vertical sense line to the respective horizontal sense line.

4. The memory device of claim 1, wherein the second portion of the multiplexor is selector SuA circuitry.

5. The memory device of claim 1, wherein the first portion of each multiplexor is formed separately from the second portion of each multiplexor.

6. The memory device of claim 1, wherein a first terminal of a multiplexor switch of each of the plurality of multiplexors is coupled to the respective vertical sense line and a second terminal of the multiplexor switch is coupled to a metal fill.

7. The memory device of claim 6, wherein the metal fill is formed in a horizontal portion of the storage node with a metal material.

8. The memory device of claim 6, wherein the metal fill runs parallel to and vertically in line with a plurality of horizontal portions of the storage node.

9. The memory device of claim 6, wherein the metal fill is coupled to a vertical portion of the storage node.

10. The memory device of claim 1, wherein the horizontal sense line is coupled to the SuA circuitry including selector SuA circuitry and the sense amplifiers.

11. The memory device of claim 1, wherein the respective vertical sense line is coupled to the second portion of the multiplexors.

12. The memory device of claim 1, wherein the horizontal sense line is coupled to the plurality of sense amplifiers.

13. The memory device of claim 1, wherein each vertical sense line is coupled to separate second portion of the multiplexor.

14. The memory device of claim 1, wherein each of the plurality of sense amplifiers is coupled to a plurality of vertical sense lines through the horizontal sense line.

15. The memory device of claim 1, wherein each sense amplifier is coupled to a plurality of second portions of the multiplexor.

16. A method of operating a memory device, comprising:
activating a vertical sense line coupled to a vertical stack of the memory device to store data in a memory cell of the vertical stack;
activating a second portion of a multiplexor coupled to the vertical stack to transfer the stored data to a horizontal sense line, wherein the second portion of the multiplexor is selector semiconductor under the array (SuA) circuitry coupled to the vertical sense line and the horizontal sense line; and
activating a multiplexor switch of a first portion of the multiplexor, wherein a first terminal of the multiplexor switch is coupled to the vertical sense line and a second terminal of the multiplexor switch is coupled to a vertical portion of a storage node of the vertical stack.

17. The method of claim 16, further comprising selecting the vertical sense line by activating the vertical sense line and deselecting a vertical sense line by activating the multiplexor switch.

18. The method of claim 16, further comprising forming the vertical sense line to extend below the first portion of the multiplexor and couple to the second portion of the multiplexor.

19. A method of sensing a memory cell in an array of memory cells, comprising:
activating a particular horizontal access line coupled to the memory cell, wherein the particular horizontal access line is one of a plurality of respective horizontal access lines;
electrically coupling a vertical sense line to a horizontal sense line via a second portion of a multiplexor in the array of memory cells, wherein:
the multiplexor includes a first portion that is coupled to the array of memory cells and configured to couple the vertical sense line to a vertical portion of a storage node; and
the second portion of the multiplexor is selector semiconductor under the array (SuA) circuitry and the vertical sense line is coupled to the memory cell; and
sensing the memory cell with a sense amplifier in the SuA circuitry, wherein the sense amplifier is coupled to the horizontal sense line.

20. The method of claim 19, wherein:
electrically coupling the vertical sense line to the horizontal sense line comprises applying a voltage to the vertical sense line coupled to the second portion of the multiplexor; and
the second portion of the multiplexor is also coupled to the horizontal sense line.

* * * * *